US011448553B2

(12) United States Patent
Hirose et al.

(10) Patent No.: US 11,448,553 B2
(45) Date of Patent: Sep. 20, 2022

(54) LIGHT DETECTION DEVICE

(71) Applicant: HAMAMATSU PHOTONICS K.K., Hamamatsu (JP)

(72) Inventors: Masaki Hirose, Hamamatsu (JP); Katsumi Shibayama, Hamamatsu (JP); Takashi Kasahara, Hamamatsu (JP); Toshimitsu Kawai, Hamamatsu (JP); Hiroki Oyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 764 days.

(21) Appl. No.: 16/082,616

(22) PCT Filed: Mar. 3, 2017

(86) PCT No.: PCT/JP2017/008483
§ 371 (c)(1),
(2) Date: Sep. 6, 2018

(87) PCT Pub. No.: WO2017/154773
PCT Pub. Date: Sep. 14, 2017

(65) Prior Publication Data
US 2019/0072431 A1    Mar. 7, 2019

(30) Foreign Application Priority Data
Mar. 9, 2016  (JP) .............................. JP2016-045513

(51) Int. Cl.
*G01J 3/26* (2006.01)
*G01J 1/04* (2006.01)
(Continued)

(52) U.S. Cl.
CPC . *G01J 3/26* (2013.01); *G01J 1/04* (2013.01); *G01J 3/02* (2013.01); *G01J 3/0259* (2013.01);
(Continued)

(58) Field of Classification Search
None
See application file for complete search history.

(56) References Cited

U.S. PATENT DOCUMENTS 4,904,090 A * 2/1990 Oliver .................... F25B 21/04
236/94
5,550,373 A    8/1996 Cole et al.
(Continued)

FOREIGN PATENT DOCUMENTS

JP   S62-153531 U   9/1987
JP   H1-250834 A   10/1989
(Continued)

OTHER PUBLICATIONS

Antila Jarkko E et al, "Advanced MEMS spectral sensor for the NIR", Visual Communications and Image Processing; Jan. 20, 2004-Jan. 20, 2004; San Jose, vol. 9375, Feb. 27, 2015, p. 93750F, XP060046363.
(Continued)

*Primary Examiner* — Shawn Decenzo
(74) *Attorney, Agent, or Firm* — Faegre Drinker Biddle & Reath LLP

(57) ABSTRACT

A light detection device includes a Fabry-Perot interference filter provided with a light transmitting region on a predetermined line, a light detector disposed on one side with respect to the Fabry-Perot interference filter on the line, a package having an opening positioned on the other side with respect to the Fabry-Perot interference filter on the line, a light transmitting member provided in the package such that the opening is blocked, and a temperature control element having an endothermic region thermally connected to the Fabry-Perot interference filter and the light detector. The endothermic region is positioned on one side with respect to the light detector on the line.

7 Claims, 8 Drawing Sheets

(51) Int. Cl.
*G02B 26/00* (2006.01)
*G01J 3/02* (2006.01)
*G01J 3/45* (2006.01)
*G02F 1/21* (2006.01)

(52) U.S. Cl.
CPC .......... *G01J 3/0286* (2013.01); *G01J 3/0289* (2013.01); *G01J 3/45* (2013.01); *G02B 26/00* (2013.01); *G02B 26/001* (2013.01); *G02F 1/21* (2013.01); *G02F 1/213* (2021.01)

(56) References Cited

U.S. PATENT DOCUMENTS

| | | | |
|---|---|---|---|
| 2002/0130403 | A1 | 9/2002 | Onodera et al. |
| 2008/0062426 | A1* | 3/2008 | Yoshida ............... G01J 5/12 356/454 |
| 2016/0245697 | A1* | 8/2016 | Shibayama ........... G01J 3/0286 |
| 2017/0322085 | A1* | 11/2017 | Antila ................. G01J 3/26 |
| 2017/0350760 | A1* | 12/2017 | Antila ................. G01J 3/0256 |
| 2018/0292267 | A1* | 10/2018 | Hirose ............. H01L 31/02005 |
| 2019/0072431 | A1* | 3/2019 | Hirose ................. G01J 3/0289 |
| 2020/0103273 | A1* | 4/2020 | Hirose ................ H01L 31/12 |
| 2021/0116297 | A1* | 4/2021 | Kasahara ............. G01J 3/0237 |

FOREIGN PATENT DOCUMENTS

| | | |
|---|---|---|
| JP | H10-511772 | 11/1998 |
| JP | 2000-039360 A | 2/2000 |
| JP | 2006-112870 A | 4/2006 |
| JP | 2006-250707 A | 9/2006 |
| TW | 200737770 A | 10/2007 |
| WO | WO 96/021140 A1 | 7/1996 |
| WO | WO-2015/064758 A1 | 5/2015 |
| WO | WO 2016/071571 A1 | 5/2016 |
| WO | WO 2016/071572 A1 | 5/2016 |

OTHER PUBLICATIONS

Pentti Niemela, "Integrated Infrarec Detectors For Industrial Process Analyzers", Proceedings of SPIE, vol. 0918, Oct. 3, 1988, p. 80, XP55627727.

J. Antila et al., "Advanced MEMS spectral sensor for the NIR", MOEMS and Miniaturized Systems XIV, Feb. 27, 2015, vol. 9375, p. 93750-p. 93750F-14.

International Preliminary Report on Patentability dated Sep. 20, 2018 for PCT/JP2017/008483.

Hironori Takahashi, Hamamatsu Photonics K.K., "Technology and Application of Compact Infrared/Terahertz Spectrometers", Infrared Technology and its Applications, 2018, No. 7, p. 101-105.

* cited by examiner

LIGHT DETECTION DEVICE

TECHNICAL FIELD

The present disclosure relates to a light detection device including a Fabry-Perot interference filter having a first mirror and a second mirror with a variable distance therebetween.

BACKGROUND ART

Patent Literature 1 discloses an etalon portion of an interferometer including a Fabry-Perot interferometer, a holder which holds the Fabry-Perot interferometer, a Peltier element which is attached to the holder, and a vacuum container which accommodates the Fabry-Perot interferometer, the holder, and the Peltier element. In the etalon portion, the Peltier element is attached to a side of the holder with respect to an optical path leading from a light receiving window of the vacuum container to a light emitting window of the vacuum container via the Fabry-Perot interferometer.

CITATION LIST

Patent Literature

Patent Literature 1: Japanese Unexamined Patent Publication No. 1-250834

SUMMARY OF INVENTION

Technical Problem

However, in the configuration described above, a Fabry-Perot interferometer is cooled from the side by a Peltier element. Therefore, when a Fabry-Perot interference filter and a light detector are accommodated in a package, the Fabry-Perot interference filter and the light detector are not uniformly cooled. Consequently, there is concern that the Fabry-Perot interference filter and the light detector may not be maintained at a uniform temperature. Furthermore, in the configuration described above, a part in the vicinity of a light receiving window of a vacuum container is cooled by the Peltier element. Therefore, when a light transmitting member is provided in an opening of the package accommodating the Fabry-Perot interference filter and the light detector, there is concern that dew condensation may occur in the light transmitting member.

An object of the present disclosure is to provide a light detection device in which dew condensation or a crack is restrained from occurring in a light transmitting member receiving light in a package, and a Fabry-Perot interference filter and a light detector accommodated in the package can be maintained at a uniform temperature.

Solution to Problem

According to an aspect of the present disclosure, there is provided a light detection device including a Fabry-Perot interference filter having a first mirror and a second mirror with a variable distance therebetween and provided with a light transmitting region transmitting light corresponding to the distance between the first mirror and the second mirror on a predetermined line, a light detector disposed on one side with respect to the Fabry-Perot interference filter on the line and configured to detect light transmitted through the light transmitting region, a package having an opening positioned on the other side with respect to the Fabry-Perot interference filter on the line and configured to accommodate the Fabry-Perot interference filter and the light detector, a light transmitting member provided in the package such that the opening is blocked, and a temperature control element having a first region thermally connected to the Fabry-Perot interference filter and the light detector and configured to function as one of an endothermic region and an exothermic region. The first region is positioned on the one side with respect to the light detector at least on the line.

In the light detection device, the first region of the temperature control element functioning as one of the endothermic region and the exothermic region is positioned on one side with respect to the light detector at least on the line. Accordingly, for example, compared to a case in which the first region of the temperature control element is positioned on a side of the Fabry-Perot interference filter and the light detector with respect to the line, the Fabry-Perot interference filter and the light detector are maintained at a uniform temperature. Moreover, at least on the line, the Fabry-Perot interference filter and the light detector are disposed between the light transmitting member and the first region of the temperature control element. Accordingly, dew condensation, which is caused by an increase in difference between the temperature of the light transmitting member and an outside air temperature (usage environment temperature of the light detection device) when the light transmitting member is excessively cooled, is restrained from occurring in the light transmitting member. In addition, a crack, which is caused by an increase in difference between the temperature of the light transmitting member and the outside air temperature when the light transmitting member is excessively heated, is restrained from occurring in the light transmitting member. Thus, according to the light detection device, dew condensation or a crack can be restrained from occurring in the light transmitting member receiving light in the package, and the Fabry-Perot interference filter and the light detector accommodated in the package can be maintained at a uniform temperature.

According to the aspect of the present disclosure, in the light detection device, an outer edge of the opening may be positioned inside an outer edge of the Fabry-Perot interference filter when seen in a direction parallel to the line. The temperature control element may have a second region thermally connected to the package and configured to function as the other of the endothermic region and the exothermic region. In this configuration, for example, compared to a case in which the outer edge of the opening is positioned outside the outer edge of the Fabry-Perot interference filter, heat is easily transferred between the second region of the temperature control element functioning as the other of the endothermic region and the exothermic region, and the light transmitting member through the package. Thus, according to this configuration, dew condensation or a crack can be more reliably restrained from occurring in the light transmitting member.

According to the aspect of the present disclosure, in the light detection device, an outer edge of the light transmitting member may be positioned outside the outer edge of the Fabry-Perot interference filter when seen in a direction parallel to the line. In this configuration, for example, compared to a case in which the outer edge of the light transmitting member is positioned inside the outer edge of the Fabry-Perot interference filter, a contact area between the light transmitting member and the package increases, so that heat is easily transferred between the light transmitting member and the package. Thus, according to this configuration, dew condensation or a crack can be more reliably restrained from occurring in the light transmitting member.

According to the aspect of the present disclosure, in the light detection device, the temperature control element may be disposed inside the package. The light detector may be disposed on the temperature control element. The Fabry-Perot interference filter may be disposed on the temperature control element such that the light detector is positioned between the temperature control element and the Fabry-Perot interference filter. According to this configuration, the Fabry-Perot interference filter and the light detector can be efficiently maintained at a uniform temperature with a compact and simple configuration.

According to the aspect of the present disclosure, the light detection device may further include a support member configured to support a portion of a bottom surface of the Fabry-Perot interference filter outside the light transmitting region, and a heat conducting member being in contact with a side surface of the Fabry-Perot interference filter and the support member. In this configuration, for example, compared to a case in which the heat conducting member that comes into contact with the side surface of the Fabry-Perot interference filter and the support member is not provided, heat is easily transferred between the Fabry-Perot interference filter and the first region of the temperature control element with the support member interposed therebetween. Thus, according to this configuration, the Fabry-Perot interference filter and the light detector can be efficiently maintained at a uniform temperature.

According to the aspect of the present disclosure, in the light detection device, the heat conducting member may be a bonding member bonding the Fabry-Perot interference filter and the support member. According to this configuration, a held state of the Fabry-Perot interference filter on the support member can be stabilized.

According to the aspect of the present disclosure, in the light detection device, the support member may have a placement surface on which the portion of the bottom surface of the Fabry-Perot interference filter outside the light transmitting region is placed. At least a portion of the side surface of the Fabry-Perot interference filter may be positioned on the placement surface such that a portion of the placement surface is disposed outside the side surface. The heat conducting member may be disposed in a corner portion formed by the side surface and the portion of the placement surface and may be in contact with each of the side surface and the portion of the placement surface. According to this configuration, the Fabry-Perot interference filter and the light detector can be more efficiently maintained at a uniform temperature, and the held state of the Fabry-Perot interference filter on the support member can be more reliably stabilized.

According to the aspect of the present disclosure, in the light detection device, the temperature control element may be embedded in a wall portion of the package. According to this configuration, the volume of a space inside the package can be reduced. As a result, the Fabry-Perot interference filter and the light detector can be more efficiently maintained at a uniform temperature.

Advantageous Effects of Invention

According to the present disclosure, it is possible to provide a light detection device in which dew condensation or a crack is restrained from occurring in the light transmitting member receiving light in the package, and the Fabry-Perot interference filter and the light detector accommodated in the package can be maintained at a uniform temperature.

DESCRIPTION OF EMBODIMENTS

Hereinafter, embodiments of the present disclosure will be described in detail with reference to the drawings. The same reference signs are applied to the same or corresponding parts in each diagram, and duplicated parts are omitted.

First Embodiment

[Configuration of Light Detection Device]

Figure 1:
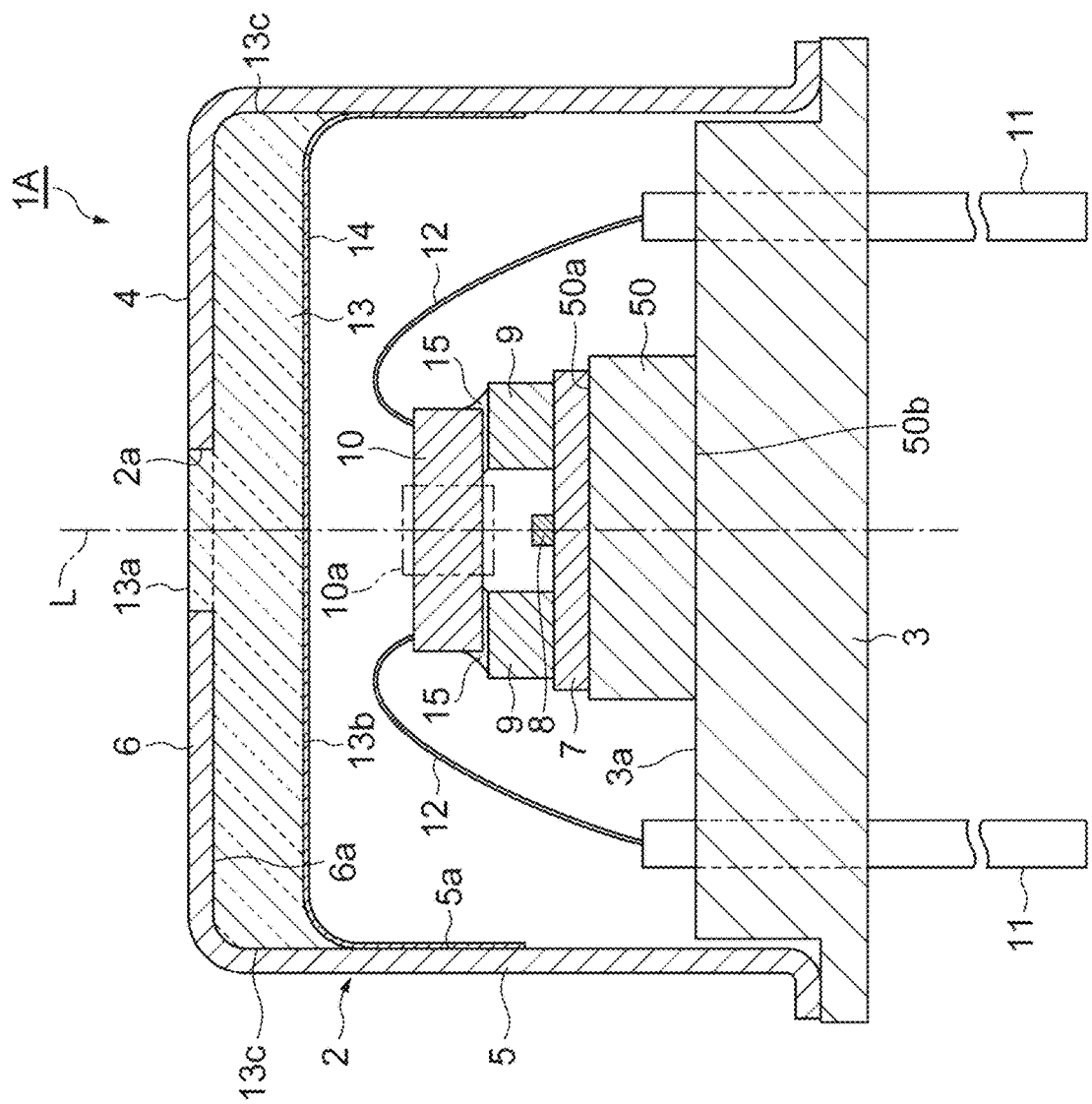
FIG. 1 is a cross-sectional view of a light detection device of a first embodiment.

As illustrated in FIG. 1, a light detection device 1A includes a package 2. The package 2 is a CAN package having a stem 3 and a cap 4. The cap 4 is integrally constituted by a side wall 5 and a ceiling 6. The ceiling 6 faces the stem 3 in a direction parallel to a predetermined line L (straight line). The stem 3 and the cap 4 are formed of metal, for example, and are joined to each other in an air-tight manner.

A temperature control element 50 is fixed to an inner surface of the stem 3. The temperature control element 50 is a Peltier element, for example, and has an endothermic region 50a and an exothermic region 50b facing each other in a direction parallel to the line L. The temperature control element 50 is disposed inside the package 2 such that the exothermic region 50b is positioned on the inner surface side of the stem 3 and the endothermic region 50a is positioned on a side opposite thereto. Accordingly, the exothermic region 50b of the temperature control element 50 is thermally connected to the package 2.

A wiring substrate 7 is fixed onto the endothermic region 50a of the temperature control element 50. As a substrate material of the wiring substrate 7, for example, silicon, ceramic, quartz, glass, or plastic can be used. A light detector 8 and a temperature compensating element such as a thermistor (not illustrated) are mounted in the wiring substrate 7. Accordingly, the endothermic region 50a of the temperature control element 50 is thermally connected to the light detector 8 and a temperature compensating element (not illustrated) with the wiring substrate 7 interposed therebetween.

The light detector 8 is disposed on the line L. More specifically, the light detector 8 is disposed such that a center line of its light receiving portion coincides with the line L.

For example, the light detector 8 is an infrared detector such as a quantum-type sensor using inGaAs and the like, and a thermal-type sensor using a thermopile, a bolometer, and the like. When detecting light in each of wavelength ranges, such as ultraviolet light, visible light, and near-infrared light, a silicon photodiode can be used as the light detector 8, for example. One light receiving portion may be provided in the light detector 8. Alternatively, a plurality of light receiving portions may be provided in an array shape. Moreover, a plurality of light detectors 8 may be mounted on the wiring substrate 7.

A plurality of support members 9 are fixed onto the wiring substrate 7 with a heat conducting member (not illustrated) interposed therebetween. As a material of each of the support members 9, for example, silicon, ceramic, quartz, glass, or plastic can be used. A Fabry-Perot interference filter 10 is fixed onto the plurality of support members 9 with a heat conducting member 15 interposed therebetween. Accordingly, the endothermic region 50a of the temperature control element 50 is thermally connected to the Fabry-Perot interference filter 10 with the wiring substrate 7, the above-described heat conducting member (not illustrated), the plurality of support members 9, and the heat conducting member 15 interposed therebetween.

The heat conducting member 15 serves as a heat conducting member transferring heat from the Fabry-Perot interference filter 10 to the support members 9 and also serves as a bonding member bonding the Fabry-Perot interference filter 10 and the support members 9. Similarly, the heat conducting member (not illustrated) disposed between the wiring substrate 7 and the support members 9 serves as a heat conducting member transferring heat from each of the support members 9 to the wiring substrate 7 and also serves as a bonding member bonding each of the support members 9 and the wiring substrate 7. As a material of the heat conducting member 15 and the heat conducting member (not illustrated), for example, a resin material (for example, the material may be a resin material, such as a silicone-based material, a urethane-based material, an epoxy-based material, an acryl-based material, and a hybrid material, which may be a conductive material or a non-conductive material) can be used.

The Fabry-Perot interference filter 10 is disposed on the line L. More specifically, the Fabry-Perot interference filter 10 is disposed such that the center line of its light transmitting region 10a coincides with the line L. The Fabry-Perot interference filter 10 may be supported by one support member 9 instead of a plurality of support members 9. In addition, the Fabry-Perot interference filter 10 may be supported by the support member 9 being integrally constituted on the wiring substrate 7.

A plurality of lead pins 11 are fixed to the stem 3. More specifically, each of the lead pins 11 penetrates the stem 3 in a state in which electrical insulation properties and air-tightness with respect to the stem 3 are maintained. Each of an electrode pad provided in the wiring substrate 7, a terminal of the temperature control element 50, a terminal of the light detector 8, a terminal of the temperature compensating element, and a terminal of the Fabry-Perot interference filter 10 is electrically connected to each of the lead pins 11 through a wire 12. Accordingly, an electrical signal can be input and output with respect to each of the temperature control element 50, the light detector 8, the temperature compensating element, and the Fabry-Perot interference filter 10.

An opening 2a is provided in the package 2. More specifically, the opening 2a is provided in the ceiling 6 of the cap 4 such that its center line coincides with the line L. A light transmitting member 13 is disposed on an inner surface 6a of the ceiling 6 such that the opening 2a is blocked. That is, the light transmitting member 13 is joined to the inner surface 6a of the ceiling 6 in an air-tight manner. The light transmitting member 13 transmits light at least within a measurement wavelength range of the light detection device 1A. The light transmitting member 13 is a plate-shaped member including a light receiving surface 13a and a light emitting surface 13b facing each other in a direction parallel to the line L, as well as a side surface 13c. For example, the light transmitting member 13 is formed of glass, quartz, silicon, germanium, or plastic. The light transmitting member 13 is formed of a material having low heat conductivity compared to the material constituting the package 2. The plate-shaped light transmitting member 13 may be fixed to the inner surface 6a of the ceiling 6, for example, with a heat conductive bonding member.

A band-pass filter 14 is provided on the light emitting surface 13b of the light transmitting member 13. The band-pass filter 14 is disposed on the light emitting surface 13b of the light transmitting member 13 through vapor deposition and pasting, for example. The band-pass filter 14 selectively transmits light within the measurement wavelength range of the light detection device 1A. For example, the band-pass filter 14 is a dielectric multilayer film constituted as a combination including a high refractive material such as $TiO_2$ and $Ta_2O_5$, and a low refractive material such as $SiO_2$ and $MgF_2$.

In the light detection device 1A, the package 2 accommodates the temperature control element 50, the wiring substrate 7, the light detector 8, the temperature compensating element (not illustrated), the plurality of support members 9, the heat conducting member 15, and the Fabry-Perot interference filter 10. The light detector 8 is disposed on the endothermic region 50a of the temperature control element 50 with the wiring substrate 7 interposed therebetween. The Fabry-Perot interference filter 10 is disposed on the endothermic region 50a of the temperature control element 50 with the wiring substrate 7, the plurality of support members 9, and the heat conducting member 15 interposed therebetween such that the light detector 8 is positioned between the temperature control element 50 and the Fabry-Perot interference filter 10.

The light detector 8 is positioned on one side (here, the stem 3 side) with respect to the Fabry-Perot interference filter 10 on the line L, and the endothermic region 50a of the temperature control element 50 is positioned on one side (here, the stem 3 side) with respect to the light detector 8 on the line L. The opening 2a of the package 2 and the light transmitting member 13 are positioned on the other side (side opposite to the one side) (here, a side opposite to the stem 3) with respect to the Fabry-Perot interference filter 10 on the line L. The Fabry-Perot interference filter 10 and the light transmitting member 13 are separated from each other with a gap interposed therebetween.

Figure 2:
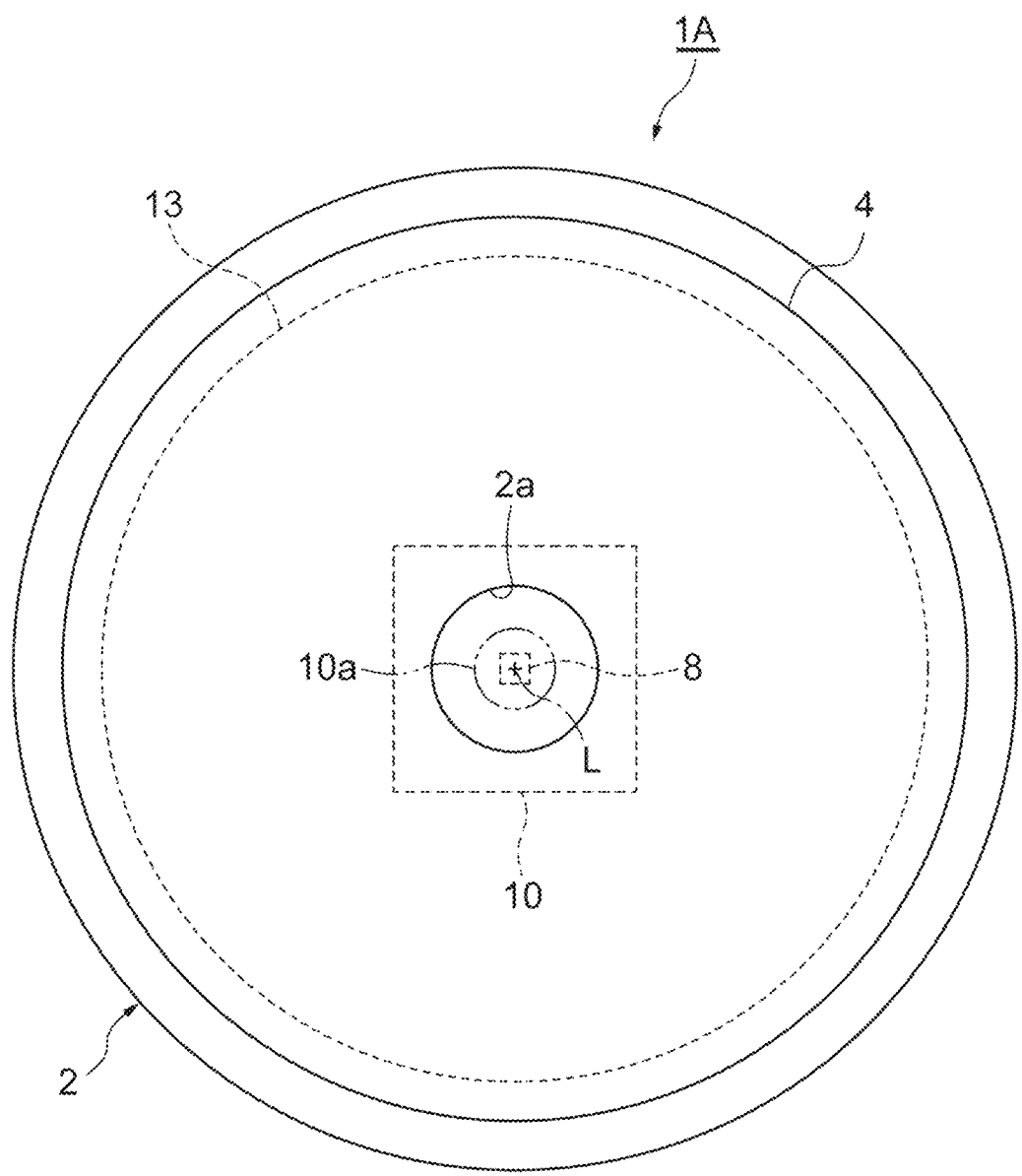
FIG. 2 is a plan view of the light detection device in FIG. 1.

A positional relationship and a size relationship between each of portions when seen in a direction parallel to the line L are as follows. As illustrated in FIG. 2, the center line of the light receiving portion of the light detector 8, the center line of the light transmitting region 10a of the Fabry-Perot interference filter 10, and the center line of the opening 2a of the package 2 coincide with the line L. An outer edge of the light transmitting region 10a of the Fabry-Perot interference filter 10 and an outer edge of the opening 2a of the package 2 have a circular shape, for example. An outer edge of the light detector 8 and an outer edge of the Fabry-Perot interference filter 10 have a rectangular shape, for example.

The outer edge of the light transmitting region 10*a* of the Fabry-Perot interference filter 10 is positioned outside the outer edge of the light detector 8. The outer edge of the opening 2*a* of the package 2 is positioned outside the outer edge of the light transmitting region 10*a* of the Fabry-Perot interference filter 10 and is positioned inside the outer edge of the Fabry-Perot interference filter 10. An outer edge of the light transmitting member 13 is positioned outside the outer edge of the Fabry-Perot interference filter 10. An outer edge of the temperature control element 50 is positioned outside the outer edge of the Fabry-Perot interference filter 10. The expression "one outer edge is positioned outside another outer edge when seen in a predetermined direction" denotes that "one outer edge surrounds another outer edge when seen in a predetermined direction" and "one outer edge includes another outer edge when seen in a predetermined direction". In addition, the expression "one outer edge is positioned inside another outer edge when seen in a predetermined direction" denotes that "one outer edge is surrounded by another outer edge when seen in a predetermined direction" and "one outer edge is included in another outer edge when seen in a predetermined direction".

Figure 3:
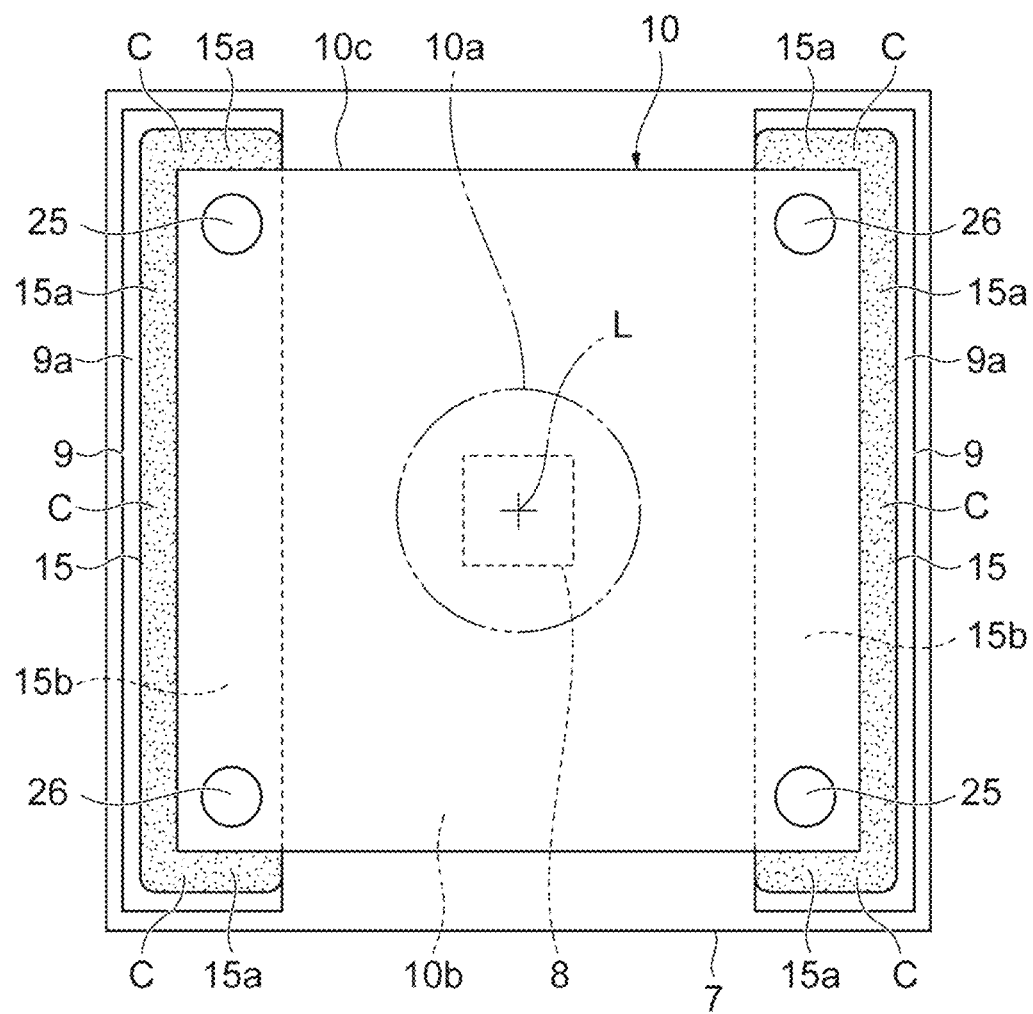
FIG. 3 is a plan view of a part including a Fabry-Perot interference filter, a support member, and a heat conducting member in the light detection device in FIG. 1.

The detailed configurations of the support members 9, the heat conducting member 15, and the Fabry-Perot interference filter 10 are as follows. As illustrated in FIG. 3 (in FIG. 3, the temperature control element 50, the wire 12, the stem 3, and the like are omitted), the Fabry-Perot interference filter 10 is supported by a pair of support members 9. The pair of support members 9 face each other with the light transmitting region 10*a* of the Fabry-Perot interference filter 10 interposed therebetween when seen in a direction parallel to the line L. On a bottom surface 10*b* of the Fabry-Perot interference filter 10, a part outside the light transmitting region 10*a*, that is, a part along a portion of a side surface 10*c* of the Fabry-Perot interference filter 10 is placed on a placement surface 9*a* of each of the support members 9. In this way, the support members 9 support parts on the bottom surface 10*b* of the Fabry-Perot interference filter 10 outside the light transmitting region 10*a*.

A portion of the side surface 10*c* of the Fabry-Perot interference filter 10 is positioned on the placement surface 9*a* of each of the support members 9 such that a portion of the placement surface 9*a* of each of the support members 9 is disposed outside a portion of the side surface 10*c* (an outer side of a portion of the side surface 10*c* when seen in a direction parallel to the line L). Accordingly, a corner portion C is formed by a portion of the side surface 10*c* and a portion of the placement surface 9*a* of each of the support members 9 (a part of a portion of the side surface 10*c* on an outer side, that is, a part of the placement surface 9*a* on which the Fabry-Perot interference filter 10 is not placed).

The heat conducting member 15 is disposed on the placement surface 9*a* of each of the support members 9 along the corner portion C. On the placement surface 9*a* of each of the support members 9, the heat conducting member 15 includes a first part 15*a* and a second part 15*b*. The first part 15*a* is a part disposed along the corner portion C. The second part 15*b* is a part disposed between the placement surface 9*a* of the support member 9 and the bottom surface 10*b* of the Fabry-Perot interference filter 10. In this way, the heat conducting member 15 comes into contact with each of a portion of the bottom surface 10*b* of the Fabry-Perot interference filter 10, a portion of the side surface 10*c*, and a portion of the placement surface 9*a* of the support member 9. The first part 15*a* leads to a side surface of a substrate 21 (which will be described below) of the Fabry-Perot interference filter 10.

In the light detection device 1A having a configuration as described above, as illustrated in FIG. 1, when light is received in the light transmitting region 10*a* of the Fabry-Perot interference filter 10 from the outside through the opening 2*a* of the package 2, the light transmitting member 13, and the band-pass filter 14, light having a predetermined wavelength is selectively transmitted (details will be described below). Light which has been transmitted through the light transmitting region 10*a* of the Fabry-Perot interference filter 10 is received by the light receiving portion of the light detector 8 and is detected by the light detector 8.

[Configuration of Fabry-Perot Interference Filter]

Figure 4:
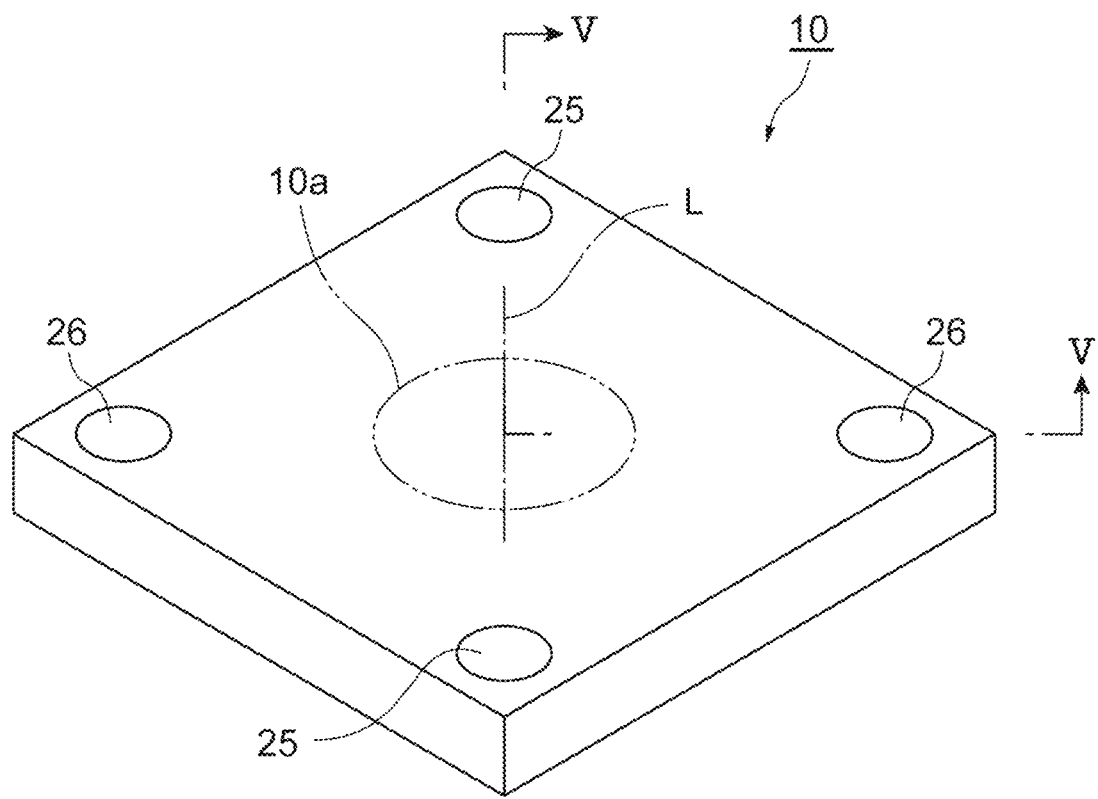
FIG. 4 is a perspective view of the Fabry-Perot interference filter of the light detection device in FIG. 1.

As illustrated in FIG. 4, in the Fabry-Perot interference filter 10, the light transmitting region 10*a* transmitting light corresponding to a distance between the first mirror and a second mirror is provided on the line L. In the light transmitting region 10*a*, the distance between the first mirror and the second mirror is controlled in an extremely accurate manner. In other words, the light transmitting region 10*a* is a region in the Fabry-Perot interference filter 10 in which the distance between the first mirror and the second mirror can be controlled to a predetermined distance in order to selectively transmit light having a predetermined wavelength, that is, a region in which light having a predetermined wavelength corresponding to the distance between the first mirror and the second mirror can be transmitted.

Figure 5:
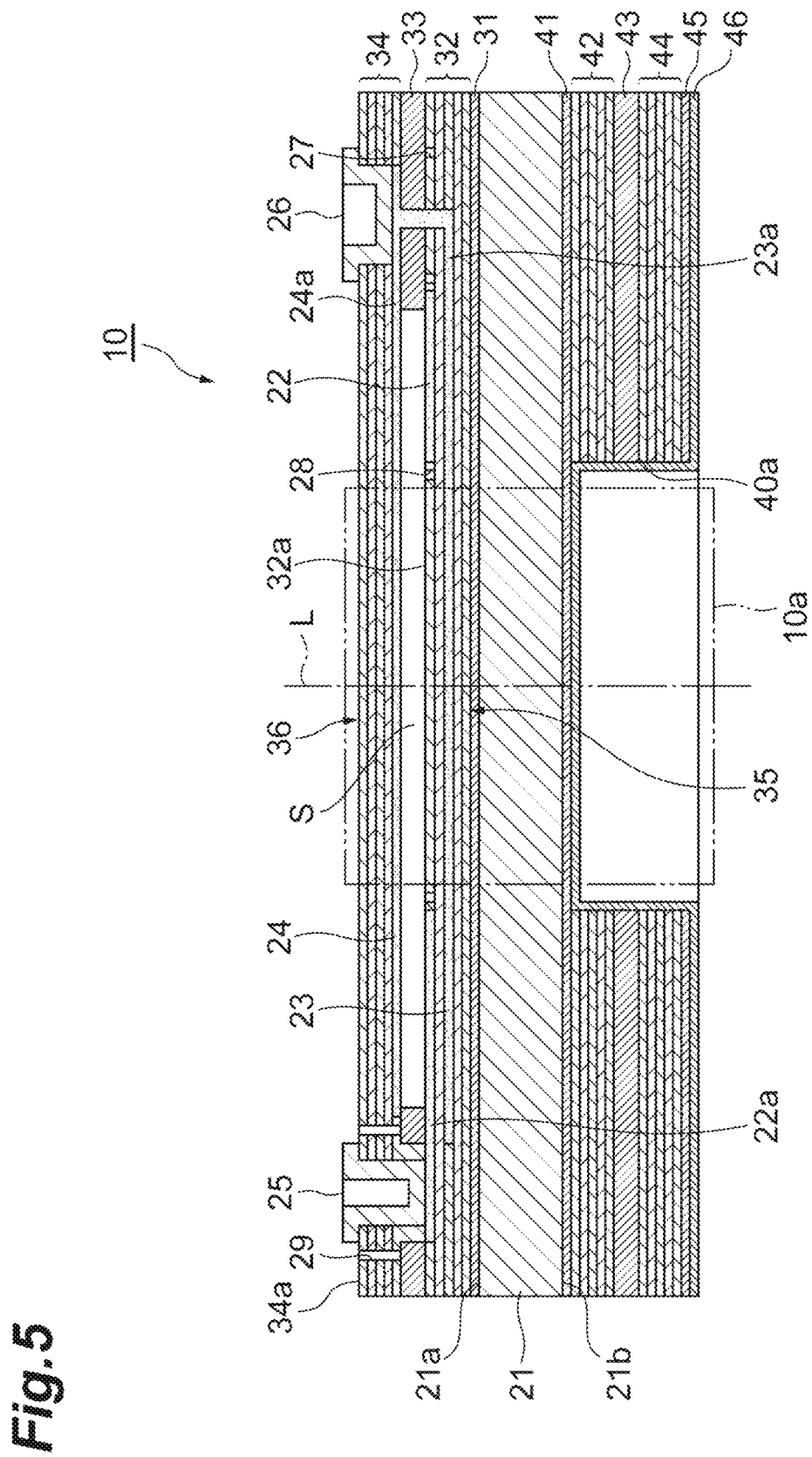
FIG. 5 is a cross-sectional view of the Fabry-Perot interference filter taken along line V-V in FIG. 4.

As illustrated in FIG. 5, the Fabry-Perot interference filter 10 includes the substrate 21. An antireflection layer 31, a first laminate 32, an intermediate layer 33, and a second laminate 34 are laminated on a surface 21*a* of the substrate 21 on a light receiving side in this order. A gap (air-gap) S is formed by the frame-shaped intermediate layer 33 between the first laminate 32 and the second laminate 34. For example, the substrate 21 is formed of silicon, quartz, and glass. When the substrate 21 is formed of silicon, the antireflection layer 31 and the intermediate layer 33 are formed of silicon oxide, for example. It is preferable that the thickness of the intermediate layer 33 be an integer multiple of ½ of a center transmission wavelength (that is, the center wavelength of a wavelength range which the Fabry-Perot interference filter 10 can transmit).

A part of the first laminate 32 corresponding to the light transmitting region 10*a* functions as a first mirror 35. The first mirror 35 is supported by the substrate 21 with the antireflection layer 31 interposed therebetween. The first laminate 32 has a configuration in which a plurality of polysilicon layers and a plurality of silicon nitride layers are alternately laminated one by one. It is preferable that the optical thickness of each of the polysilicon layers and the silicon nitride layers constituting the first mirror 35 be an integer multiple of ¼ of the center transmission wavelength. Silicon oxide layers may be used instead of the silicon nitride layers.

A part of the second laminate 34 corresponding to the light transmitting region 10*a* functions as a second mirror 36 facing the first mirror 35 with the gap S interposed therebetween. The second mirror 36 is supported by the substrate 21 with the antireflection layer 31, the first laminate 32, and the intermediate layer 33 interposed therebetween. The second laminate 34 has a configuration in which a plurality of polysilicon layers and a plurality of silicon nitride layers are alternately laminated one by one. It is preferable that the optical thickness of each of the polysilicon layers and the silicon nitride layers constituting the second mirror 36 be an integer multiple of ¼ of the center transmission wavelength. Silicon oxide layers may be used instead of the silicon nitride layers.

A plurality of penetration holes (not illustrated) leading from a surface 34a of the second laminate 34 to the gap S are provided in a part in the second laminate 34 corresponding to the gap S. The plurality of penetration holes are formed to the extent that the function of the second mirror 36 is not substantially affected. The plurality of penetration holes are used for forming the gap S by removing a portion of the intermediate layer 33 through etching.

A first electrode 22 is formed in the first mirror 35 such that the light transmitting region 10a is surrounded. A second electrode 23 is formed in the first mirror 35 in a manner of including the light transmitting region 10a. The first electrode 22 and the second electrode 23 are formed by doping impurities in the polysilicon layers to reduce resistance. It is preferable that the size of the second electrode 23 be a size including the entirety of the light transmitting region 10a. However, the size may be approximately the same as the size of the light transmitting region 10a.

A third electrode 24 is formed in the second mirror 36. The third electrode 24 faces the first electrode 22 and the second electrode 23 with the gap S interposed therebetween in a direction parallel to the line L. The third electrode 24 is formed by doping impurities in the polysilicon layers to reduce resistance.

In the Fabry-Perot interference filter 10, the second electrode 23 is positioned on a side opposite to the third electrode 24 with respect to the first electrode 22 in a direction parallel to the line L. That is, the first electrode 22 and the second electrode 23 are not positioned on the same plane in the first mirror 35. The second electrode 23 is farther away from the third electrode 24 than the first electrode 22.

A pair of terminals 25 are provided to face each other with the light transmitting region 10a interposed therebetween. Each of the terminals 25 is disposed inside the penetration hole leading from the surface 34a of the second laminate 34 to the first laminate 32. Each of the terminals 25 is electrically connected to the first electrode 22 via a wiring 22a.

A pair of terminals 26 are provided to face each other with the light transmitting region 10a interposed therebetween. Each of the terminals 26 is disposed inside the penetration hole leading from the surface 34a of the second laminate 34 to a location in front of the intermediate layer 33. Each of the terminals 26 is electrically connected to the second electrode 23 via a wiring 23a and is electrically connected to the third electrode 24 via a wiring 24a. The direction in which the pair of terminals 25 face each other is orthogonal to the direction in which the pair of terminals 26 face each other (refer to FIG. 4).

Trenches 27 and 28 are provided on a surface 32a of the first laminate 32. The trench 27 annularly extends to surround the wiring 23a extending from the terminal 26 along a direction parallel to the line L. The trench 27 electrically insulates the first electrode 22 and the wiring 23a from each other. The trench 28 annularly extends along an inner edge of the first electrode 22. The trench 28 electrically insulates the first electrode 22 and a region inside the first electrode 22 from each other. The region inside each of the trenches 27 and 28 may be an insulating material or a gap.

A trench 29 is provided on the surface 34a of the second laminate 34. The trench 29 annularly extends such that the terminal 25 is surrounded. The trench 29 electrically insulates the terminal 25 and the third electrode 24 from each other. The region inside the trench 28 may be an insulating material or a gap.

An antireflection layer 41, a third laminate 42, an intermediate layer 43, and a fourth laminate 44 are laminated on a surface 21b of the substrate 21 on a light emitting side in this order. The antireflection layer 41 and the intermediate layer 43 have configurations similar to those of the antireflection layer 31 and the intermediate layer 33 respectively. The third laminate 42 and the fourth laminate 44 have lamination structures respectively symmetrical to the first laminate 32 and the second laminate 34 with respect to the substrate 21. The antireflection layer 41, the third laminate 42, the intermediate layer 43, and the fourth laminate 44 have a function of restraining the substrate 21 from warping.

An opening 40a is provided in the antireflection layer 41, the third laminate 42, the intermediate layer 43, and the fourth laminate 44 in a manner of including the light transmitting region 10a. The opening 40a has a diameter substantially the same as the size of the light transmitting region 10a. The opening 40a is open on the light emitting side, and a bottom surface of the opening 40a leads to the antireflection layer 41. A light shielding layer 45 is formed on a surface of the fourth laminate 44 on the light emitting side. The light shielding layer 45 is formed of aluminum, for example. A protective layer 46 is formed on a surface of the light shielding layer 45 and an inner surface of the opening 40a. The protective layer 46 is formed of aluminum oxide, for example. An optical influence of the protective layer 46 can be disregarded by causing the thickness of the protective layer 46 to range from 1 to 100 nm (preferably, 30 nm approximately).

In the Fabry-Perot interference filter 10 having a configuration as described above, when a voltage is applied to a part between the first electrode 22 and the third electrode 24 via the terminals 25 and 26, an electrostatic force corresponding to the voltage is generated between the first electrode 22 and the third electrode 24. Due to the electrostatic force, the second mirror 36 is attracted to the side of the first mirror 35 fixed to the substrate 21, so that the distance between the first mirror 35 and the second mirror 36 is adjusted. In this way, in the Fabry-Perot interference filter 10, the distance between the first mirror 35 and the second mirror 36 is variable.

A wavelength of light transmitted through the Fabry-Perot interference filter 10 depends on the distance between the first mirror 35 and the second mirror 36 in the light transmitting region 10a. Therefore, the wavelength of light to be transmitted can be suitably selected by adjusting a voltage applied to a part between the first electrode 22 and the third electrode 24. At this time, the second electrode 23 has a potential equal to that of the third electrode 24. Therefore, the second electrode 23 functions as a compensation electrode for keeping the first mirror 35 and the second mirror 36 flat in the light transmitting region 10a.

In the light detection device 1A, while changing a voltage applied to the Fabry-Perot interference filter 10 (that is, while changing the distance between the first mirror 35 and the second mirror 36 in the Fabry-Perot interference filter 10), the light detector 8 detects light which has been transmitted through the light transmitting region 10a of the Fabry-Perot interference filter 10, so that a spectroscopic spectrum can be obtained.

[Operations and Effects]

In the light detection device 1A, the endothermic region 50a of the temperature control element 50 is positioned on one side with respect to the light detector 8 on the line L.

Accordingly, for example, compared to a case in which the endothermic region 50a of the temperature control element 50 is positioned on a side of the Fabry-Perot interference filter 10 and the light detector 8 with respect to the line L, the Fabry-Perot interference filter 10 and the light detector 8 are uniformly cooled. Particularly, an upper surface of the temperature control element 50 and a lower surface of the wiring substrate 7, an upper surface of the wiring substrate 7 and a lower surface of the light detector 8, the upper surface of the wiring substrate 7 and lower surfaces of the support members 9, and upper surfaces of the support members 9 and a lower surface of the Fabry-Perot interference filter 10 are in surface contact with each other with a bonding agent or the like interposed therebetween. Accordingly, for example, compared to a case in which members are in point contact with each other, cooling is efficiently performed. Moreover, on the line L, the Fabry-Perot interference filter 10 and the light detector 8 are disposed between the light transmitting member 13 and the endothermic region 50a of the temperature control element 50. Accordingly, dew condensation, which is caused by an increase in difference between the temperature of the light transmitting member 13 and an outside air temperature (usage environment temperature of the light detection device 1A) when the light transmitting member 13 is excessively cooled, is restrained from occurring in the light transmitting member 13. Thus, according to the light detection device 1A, dew condensation can be restrained from occurring in the light transmitting member 13 receiving light in the package 2, and the Fabry-Perot interference filter 10 and the light detector 8 accommodated in the package 2 can be maintained at a uniform temperature.

In this way, in the light detection device 1A, since the Fabry-Perot interference filter 10 is uniformly cooled by the temperature control element 50, a constant temperature in the Fabry-Perot interference filter 10 can be maintained independently of the usage environment temperature of the light detection device 1A. As a result, shifting of a wavelength of transmitted light caused by a change in usage environment temperature of the light detection device 1A can be restrained. Particularly, in the Fabry-Perot interference filter 10 having the first mirror 35 and the second mirror 36 with a variable distance therebetween, the distance between the first mirror 35 and the second mirror 36 is required to be controlled in an extremely accurate manner by operating the thin film-shaped second mirror 36 in an extremely accurate manner. Here, when the temperatures of parts are not uniform in the Fabry-Perot interference filter 10, it becomes difficult to control the distance between the first mirror 35 and the second mirror 36 in an extremely accurate manner. Therefore, it is very important to maintain the Fabry-Perot interference filter 10 at a uniform temperature. Moreover, since the light detector 8 is uniformly cooled by the temperature control element 50, a dark current generated in the light detector 8 can be reduced.

In a configuration in which the temperature control element 50 is disposed inside the package 2, compared to a configuration in which the temperature control element 50 is disposed outside the package 2, the capacity inside the package 2 is easily increased. Therefore, in the configuration in which the temperature control element 50 is disposed inside the package 2, when the capacity inside the package 2 increases, it becomes more difficult to maintain a uniform temperature inside the package 2. However, according to the configuration of the light detection device 1A, the Fabry-Perot interference filter 10 and the light detector 8 which significantly affect the accuracy of a measurement result can be effectively maintained at a uniform temperature.

Here, a risk caused by dew condensation occurring in the light transmitting member 13 will be described. First, when dew condensation occurs on the light receiving surface 13a and/or the light emitting surface 13b of the light transmitting member 13, there is concern that the quantity of light received in the package 2 may decrease and the sensitivity of the light detector 8 may deteriorate. Moreover, in regard to light received in the package 2, there is concern that multiple reflection, scattering, a lens effect, or the like may occur and cause stray light, so that resolution of transmitted light received in the light detector 8, an S/N ratio, or the like may deteriorate. In this way, there is concern that when dew condensation occurs on the light receiving surface 13a and/or the light emitting surface 13b of the light transmitting member 13, stability of detection properties in the light detector 8 may deteriorate.

In addition, there is concern that when dew condensation occurs on the second mirror 36 of the Fabry-Perot interference filter 10, a peak wavelength of transmitted light with respect to a control voltage applied to the Fabry-Perot interference filter 10 may change. Moreover, there is concern that the first mirror 35 and the second mirror 36 may adhere to each other due to moisture, which may lead to a malfunction.

In contrast, in the light detection device 1A, since dew condensation can be restrained from occurring in the light transmitting member 13, it is possible to avoid the above-described risk. Particularly, when moisture remains inside the package 2 in a production process, the configuration of the light detection device 1A in which dew condensation can be restrained from occurring in the light transmitting member 13 is effective. Moreover, since the configuration of the light detection device 1A is a configuration in which dew condensation can be restrained from occurring in the light transmitting member 13, the light detection device 1A can be reduced in size by narrowing the distance between the members.

In the light detection device 1A, when seen in a direction parallel to the line L, the outer edge of the opening 2a of the package 2 is positioned inside the outer edge of the Fabry-Perot interference filter 10, and the exothermic region 50b of the temperature control element 50 is thermally connected to the package 2. Accordingly, for example, compared to a case in which the outer edge of the opening 2a is positioned outside the outer edge of the Fabry-Perot interference filter 10, heat is easily transferred between the exothermic region 50b of the temperature control element 50 and the light transmitting member 13 through the package 2 (specifically, heat is easily transferred from the exothermic region 50b of the temperature control element 50 to the light transmitting member 13 through the package 2). Thus, dew condensation can be more reliably restrained from occurring in the light transmitting member 13.

In the light detection device 1A, when seen in a direction parallel to the line L, the outer edge of the light transmitting member 13 is positioned outside the outer edge of the Fabry-Perot interference filter 10. Accordingly, for example, compared to a case in which the outer edge of the light transmitting member 13 is positioned inside the outer edge of the Fabry-Perot interference filter 10, a contact area between the light transmitting member 13 and the package 2 increases, so that heat is easily transferred between the light transmitting member 13 and the package 2 (specifically, heat is easily transferred from the exothermic region 50b of the temperature control element 50 to the light transmitting member 13 through the package 2). Moreover, in the light detection device 1A, since the side surface 13c of the light transmitting member 13 comes into contact with the package 2, the contact area between the light transmitting member 13 and the package 2 further increases. Thus, dew condensation can be more reliably restrained from occurring in the light transmitting member 13. Moreover, according to this configuration, even if the wire 12 connected to the Fabry-Perot interference filter 10 is bent, the insulative light transmitting member 13 prevents the wire 12 and the package 2 from coming into contact with each other. Accordingly, an electrical signal for controlling the Fabry-Perot interference filter 10 is prevented from flowing in the package 2, so that the Fabry-Perot interference filter 10 can be controlled with high accuracy.

In the light detection device 1A, the temperature control element 50 is disposed inside the package 2, the light detector 8 is disposed on the temperature control element 50, and the Fabry-Perot interference filter 10 is disposed on the temperature control element 50 such that the light detector 8 is positioned between the temperature control element 50 and the Fabry-Perot interference filter 10. Accordingly, the Fabry-Perot interference filter 10 and the light detector 8 can be efficiently maintained at a uniform temperature with a compact and simple configuration.

As an example, in a direction parallel to the line L, the thickness of the temperature control element 50 ranges from 0.7 to 2 mm, the thickness of the wiring substrate 7 is 0.3 mm, the thickness of the support member 9 is 0.6 mm, and the thickness of the Fabry-Perot interference filter 10 is 0.6 mm. In addition, the height of a part of the lead pin 11 protruding from an upper surface of the stem 3 ranges from 0.2 to 1 mm (for example, 0.5 mm). That is, the temperature control element 50 is thicker than the wiring substrate 7, the support members 9, and the Fabry-Perot interference filter 10. Since the temperature control element 50 is thick, the light detector 8 and the Fabry-Perot interference filter 10 are unlikely to be affected by heat generated from the exothermic region 50b. On the other hand, since the wiring substrate 7, the support members 9, and the Fabry-Perot interference filter 10 are thin, cooling can be efficiently performed by the endothermic region 50a.

In addition, in the light detection device 1A, the upper surface of the lead pin 11 is at a position lower than the upper surface of each of the temperature control element 50, the wiring substrate 7, the support members 9, and the Fabry-Perot interference filter 10. Accordingly, the wire 12 is easily connected to the lead pin 11 from the light detector 8 and the Fabry-Perot interference filter 10 (particularly, the wire 12, which is drawn out from the light detector 8 or the temperature compensating element disposed to be covered by the Fabry-Perot interference filter 10 from above, can be restrained from interfering with the Fabry-Perot interference filter 10).

In consideration of easiness of connecting the wire 12 to the lead pin 11 from the Fabry-Perot interference filter 10, it is preferable that the height of the Fabry-Perot interference filter 10 from the stem 3 be not excessively significant. Accordingly, since the height of the Fabry-Perot interference filter 10 from the stem 3 becomes excessive in a configuration in which the temperature control element 50 is disposed under a lamination of the wiring substrate 7, the support member 9, and the Fabry-Perot interference filter 10, which is not preferable from the viewpoint of connecting a wire to the lead pin 11. However, in the light detection device 1A, the height of the Fabry-Perot interference filter 10 from the stem 3 is restrained by restricting the thicknesses of the wiring substrate 7, the support member 9, and the Fabry-Perot interference filter 10, and the disadvantage is thereby minimized.

In the light detection device 1A, the Fabry-Perot interference filter 10 and the light transmitting member 13 are separated from each other with a gap interposed therebetween. Accordingly, the Fabry-Perot interference filter 10 can be restrained from being affected by the usage environment temperature of the light detection device 1A and being affected by heat from the package 2 and the light transmitting member 13. Particularly, in the light detection device 1A, the volume of a space on an upper side of the Fabry-Perot interference filter 10 (a space between the upper surface of the Fabry-Perot interference filter 10 and the light emitting surface 13b of the light transmitting member 13) is greater than the volume of a space on a lower side of the Fabry-Perot interference filter 10 (a space between the lower surface of the Fabry-Perot interference filter 10 and the upper surface of the wiring substrate 7). Therefore, heat transfer between the Fabry-Perot interference filter 10 and the light transmitting member 13 is effectively restrained.

In the light detection device 1A, the support members 9 which support parts on the bottom surface 10b of the Fabry-Perot interference filter 10 outside the light transmitting region 10a, the side surface 10c of the Fabry-Perot interference filter 10, and the heat conducting member 15 which comes into contact with the support members 9 are provided. Accordingly, for example, compared to a case in which the side surface 10c of the Fabry-Perot interference filter 10, and the heat conducting member 15 coming into contact with the support members 9 are not provided, heat is easily transferred between the Fabry-Perot interference filter 10 and the endothermic region 50a of the temperature control element 50 with the support members 9 interposed therebetween (specifically, heat is easily transferred from the Fabry-Perot interference filter 10 to the endothermic region 50a of the temperature control element 50 with the support members 9 interposed therebetween). Thus, the Fabry-Perot interference filter 10 and the light detector 8 can be efficiently maintained at a uniform temperature.

In the light detection device 1A, the heat conducting member 15 is a bonding member bonding the Fabry-Perot interference filter 10 and the support members 9. Accordingly, a held state of the Fabry-Perot interference filter 10 on the support members 9 can be stabilized.

In the light detection device 1A, the heat conducting member 15 is disposed in the corner portion C and comes into contact with each of a portion of the side surface 10c of the Fabry-Perot interference filter 10 and a portion of the placement surface 9a of the support member 9. Accordingly, the Fabry-Perot interference filter 10 and the light detector 8 can be more efficiently maintained at a uniform temperature, and the held state of the Fabry-Perot interference filter 10 on the support members 9 can be more reliably stabilized. Particularly, when the heat conducting member 15 is disposed in the corner portion C, the heat conducting member 15 can be increased in volume, and the posture of the heat conducting member 15 can be stabilized, thereby being effective.

Second Embodiment

[Configuration of Light Detection Device]

Figure 6:
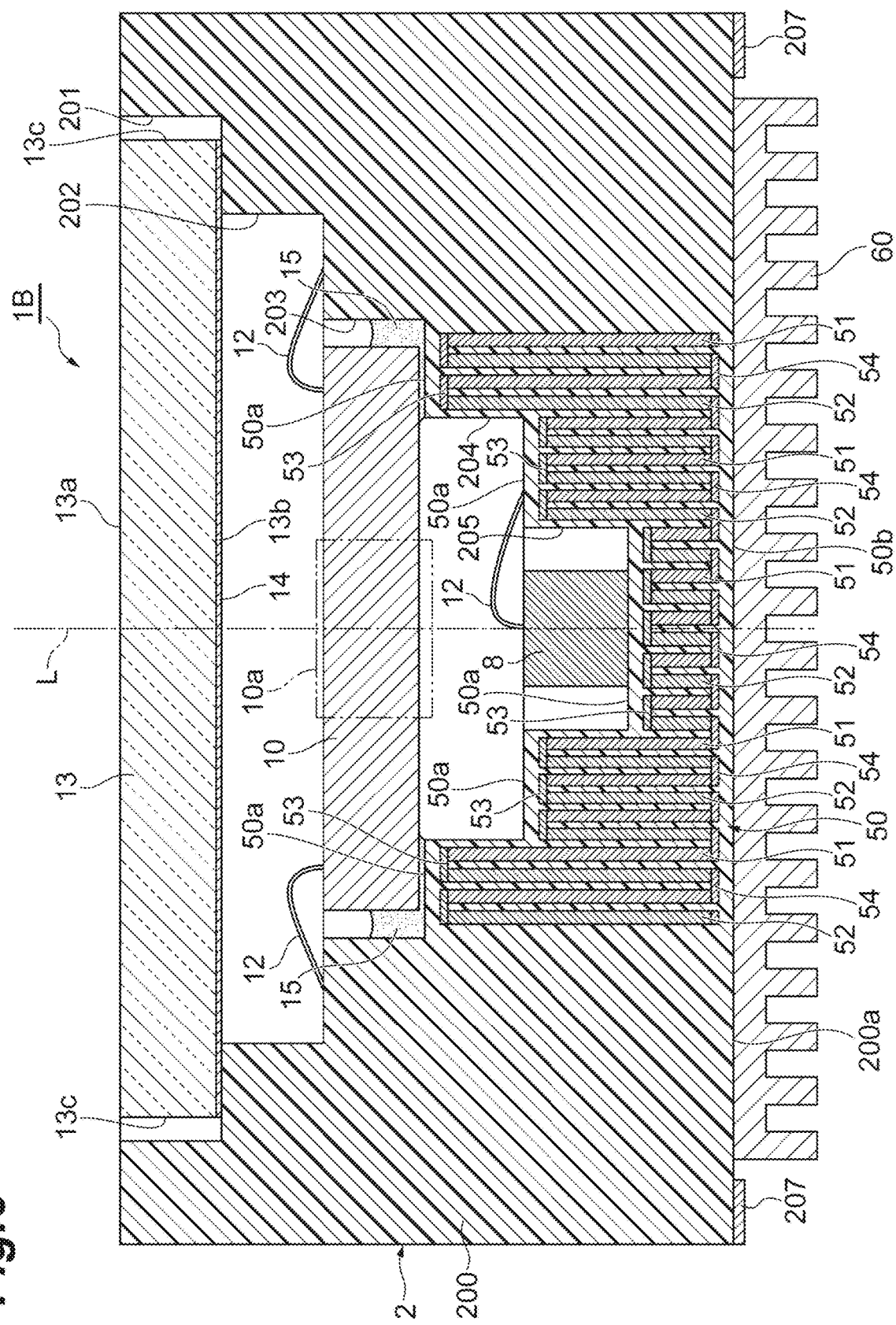
FIG. 6 is a cross-sectional view of a light detection device of a second embodiment.

As illustrated in FIG. 6, a light detection device 1B differs from the above-described light detection device 1A in that the light detection device 1B is configured as a surface mount device (SMD). The light detection device 1B includes a main body portion 200 constituting the package 2 which accommodates the light detector 8 and the Fabry-Perot interference filter 10. As a material of the main body portion 200, for example, ceramic and resin can be used. A plurality of wirings (not illustrated) are laid in the main body portion 200. A plurality of mounting electrode pads 207 are provided on a bottom surface 200a of the main body portion 200. The wirings (not illustrated) and the mounting electrode pads 207 corresponding to each other are electrically connected to each other.

A first widened portion 201, a second widened portion 202, a third widened portion 203, a fourth widened portion 204, and a recessed portion 205 are formed in the main body portion 200. The recessed portion 205, the fourth widened portion 204, the third widened portion 203, the second widened portion 202, and the first widened portion 201 are arranged side by side from the bottom surface 200a side in this order with the predetermined line L (straight line) as the center line and form one space which is open to a side opposite to the bottom surface.

The light detector 8 is fixed to a bottom surface of the recessed portion 205. The bottom surface of the recessed portion 205 and the bottom surface of the light detector 8 are bonded to each other, for example, with a heat conductive bonding member (not illustrated) interposed therebetween. The light detector 8 is disposed on the line L. More specifically, the light detector 8 is disposed such that the center line of its light receiving portion coincides with the line L. The Fabry-Perot interference filter 10 is fixed to the bottom surface of the third widened portion 203 with the heat conducting member 15 interposed therebetween. That is, the bottom surface of the third widened portion 203 and the bottom surface 10b of the Fabry-Perot interference filter 10 are bonded to each other with the heat conducting member 15 interposed therebetween. The Fabry-Perot interference filter 10 is disposed on the line L. More specifically, the Fabry-Perot interference filter 10 is disposed such that the center line of its light transmitting region 10a coincides with the line L. The plate-shaped light transmitting member 13 is fixed to the bottom surface of the first widened portion 201, for example, with a heat conductive bonding member. The band-pass filter 14 is provided on the light emitting surface 13b of the light transmitting member 13. A temperature compensating element (not illustrated) is embedded in the main body portion 200.

Each of the terminal of the light detector 8, the terminal of the temperature compensating element, and the terminal of the Fabry-Perot interference filter 10 is electrically connected to the corresponding mounting electrode pad 207 via the wire 12 and a wiring (not illustrated) interposed therebetween, or via only a wiring (not illustrated). Accordingly, an electrical signal can be input and output with respect to each of the light detector 8, the temperature compensating element, and the Fabry-Perot interference filter 10.

Moreover, the temperature control element 50 is embedded in a predetermined part of the main body portion 200 which is a wall portion of the package 2. More specifically, the temperature control element 50 is embedded in the main body portion 200 throughout the entirety of a part between the bottom surface of the recessed portion 205 and the bottom surface 200a of the main body portion 200, a part between the bottom surface of the fourth widened portion 204 and the bottom surface 200a of the main body portion 200, and a part between the bottom surface of the third widened portion 203 and the bottom surface 200a of the main body portion 200.

For example, the temperature control element 50 is a Peltier element. In the temperature control element 50, a plurality of N-type semiconductor layers 51 and a plurality of P-type semiconductor layers 52 are alternately arranged side by side. End portions of the N-type semiconductor layer 51 and the P-type semiconductor layer 52 adjacent to each other on a side opposite to the bottom surface 200a are connected to each other with a first metal member 53 interposed therebetween, and end portions of the N-type semiconductor layer 51 and the P-type semiconductor layer 52 adjacent to each other on the bottom surface 200a side are connected to each other with a second metal member 54 interposed therebetween, such that all of the N-type semiconductor layers 51 and the P-type semiconductor layers 52 alternately arranged side by side are connected in series.

Focusing on the N-type semiconductor layer 51 and the P-type semiconductor layer 52 connected to each other by the first metal member 53, when a current flows in a direction from the N-type semiconductor layer 51 to the P-type semiconductor layer 52, an endothermic phenomenon occurs in the first metal member 53. Accordingly, the bottom surface of the third widened portion 203, the bottom surface of the fourth widened portion 204, and the bottom surface of the recessed portion 205 function as the endothermic region 50a.

Focusing on the P-type semiconductor layer 52 and the N-type semiconductor layer 51 connected to each other by the second metal member 54, when a current flow in a direction from the P-type semiconductor layer 52 to the N-type semiconductor layer 51, an exothermic phenomenon occurs in the second metal member 54. Accordingly, the bottom surface 200a of the main body portion 200 functions as the exothermic region 50b.

The terminal of the temperature control element 50 is electrically connected to the corresponding mounting electrode pad 207 via a wiring (not illustrated). Accordingly, an electrical signal can be input and output with respect to the temperature control element 50. In the temperature control element 50, all of the N-type semiconductor layers 51 and the P-type semiconductor layers 52 alternately arranged side by side are connected in series. Therefore, when a current flows in a predetermined direction, a current flows in a direction from the N-type semiconductor layer 51 to the P-type semiconductor layer 52 in the first metal member 53, and the bottom surface of the third widened portion 203, the bottom surface of the fourth widened portion 204, and the bottom surface of the recessed portion 205 function as the endothermic region 50a. On the other hand, a current flows in a direction from the P-type semiconductor layer 52 to the N-type semiconductor layer 51 in the second metal member 54, and the bottom surface 200a of the main body portion 200 functions as the exothermic region 50b.

In the light detection device 1B, the package 2 accommodates the light detector 8, the heat conducting member 15, and the Fabry-Perot interference filter 10. The temperature compensating element (not illustrated) and the temperature control element 50 are embedded in the wall portion of the package 2. The light detector 8 is disposed on the bottom surface of the recessed portion 205 which is the endothermic region 50a of the temperature control element 50. The bottom surface of the recessed portion 205 (endothermic region 50a) is thermally connected to the light detector 8. The Fabry-Perot interference filter 10 is disposed on the bottom surface of the third widened portion 203 which is the endothermic region 50a of the temperature control element 50 with the heat conducting member 15 interposed therebetween such that the light detector 8 is positioned between the temperature control element 50 and the Fabry-Perot interference filter 10. The bottom surface of the third widened portion 203 (endothermic region 50a) is thermally connected to the Fabry-Perot interference filter 10.

A heat sink 60 is bonded to the bottom surface 200a of the main body portion 200 which is the exothermic region 50b of the temperature control element 50 with a heat conductive bonding member interposed therebetween, for example. Accordingly, heat generated from the exothermic region 50b can be efficiently radiated through the heat sink 60. When the heat sink 60 is thicker than the electrode pad 207, the light detection device 1B can be mounted on an external wiring substrate by providing a penetration hole such that the heat sink 60 does not interfere with the external wiring substrate on which the light detection device 1B is mounted. Alternatively, without providing a penetration hole in the external wiring substrate, the electrode pad 207 may be disposed on the side surface of the main body portion 200, and the light detection device 1B may be mounted such that the line L becomes substantially horizontal with the surface of the external wiring substrate. Alternatively, a metal plate thinner than the electrode pad 207 may be bonded to the bottom surface 200a of the main body portion 200 to be used as the heat sink 60. In this case, if the metal plate is formed of the same material (for example, gold, silver, copper, aluminum, and tungsten) as that of the electrode pad 207, forming steps with respect to the bottom surface 200a can be performed at the same time.

The light detector 8 is positioned on one side with respect to the Fabry-Perot interference filter 10 on the line L (here, the bottom surface 200a side of the main body portion 200), and the bottom surface of the recessed portion 205 which is the endothermic region 50a of the temperature control element 50 is positioned on one side with respect to the light detector 8 on the line L (here, the bottom surface 200a side of the main body portion 200). The opening (first widened portion 201) of the package 2 and the light transmitting member 13 are positioned on the other side with respect to the Fabry-Perot interference filter 10 on the line L (side opposite to the one side) (here, a side opposite to the bottom surface 200a of the main body portion 200). The Fabry-Perot interference filter 10 and the light transmitting member 13 are separated from each other with a gap interposed therebetween.

In the light detection device 1B, the heat conducting member 15 is disposed on the bottom surface of the third widened portion 203 along a clearance between the side surface of the Fabry-Perot interference filter 10 and an inner surface of the third widened portion 203. The heat conducting member 15 includes a first part which is disposed along the clearance between the side surface of the Fabry-Perot interference filter 10 and the inner surface of the third widened portion 203, and a second part which is disposed between the bottom surface of the third widened portion 203 and the bottom surface of the Fabry-Perot interference filter 10. In this way, the heat conducting member 15 comes into contact with each of a portion of the bottom surface of the Fabry-Perot interference filter 10, a portion of the side surface, and the bottom surface of the third widened portion 203. The above-described first part leads to the side surface of the substrate 21 of the Fabry-Perot interference filter 10.

In the light detection device 1B having a configuration as described above, when light is received in the light transmitting region 10a of the Fabry-Perot interference filter 10 from the outside with the opening (first widened portion 201) of the package 2, the light transmitting member 13, and the band-pass filter 14 interposed therebetween, light having a predetermined wavelength is selectively transmitted in accordance with the distance between the first mirror 35 and the second mirror 36 in the light transmitting region 10a. Light which has been transmitted through the light transmitting region 10a of the Fabry-Perot interference filter 10 is received by the light receiving portion of the light detector 8 and is detected by the light detector 8. In the light detection device 1B, while changing a voltage applied to the Fabry-Perot interference filter 10 (that is, while changing the distance between the first mirror 35 and the second mirror 36 in the Fabry-Perot interference filter 10), the light detector 8 detects light which has been transmitted through the light transmitting region 10a of the Fabry-Perot interference filter 10, so that a spectroscopic spectrum can be obtained.

[Operations and Effects]

In the light detection device 1B, the bottom surface of the recessed portion 205 in the endothermic region 50a of the temperature control element 50 is positioned on one side with respect to the light detector 8 on the line L. Moreover, the bottom surface of the third widened portion 203 in the endothermic region 50a of the temperature control element 50 is positioned on one side with respect to the Fabry-Perot interference filter 10. Accordingly, the Fabry-Perot interference filter 10 and the light detector 8 are uniformly cooled. Particularly, the bottom surface of the recessed portion 205 and the lower surface of the light detector 8, and the bottom surface of the third widened portion 203 and the lower surface of the Fabry-Perot interference filter 10 are in surface contact with each other with a bonding agent or the like interposed therebetween. Accordingly, for example, compared to a case in which members are in point contact with each other, cooling is efficiently performed. Moreover, on the line L, the Fabry-Perot interference filter 10 and the light detector 8 are disposed between the light transmitting member 13 and the bottom surface of the recessed portion 205. Moreover, the Fabry-Perot interference filter 10 is disposed between the light transmitting member 13 and the bottom surface of the third widened portion 203. Accordingly, dew condensation, which is caused by an increase in difference between the temperature of the light transmitting member 13 and an outside air temperature (usage environment temperature of the light detection device 1B) when the light transmitting member 13 is excessively cooled, is restrained from occurring in the light transmitting member 13. Thus, according to the light detection device 1B dew condensation can be restrained from occurring in the light transmitting member 13 receiving light in the package 2, and the Fabry-Perot interference filter 10 and the light detector 8 accommodated in the package 2 can be maintained at a uniform temperature.

In the light detection device 1B, the heat conducting member 15 is a bonding member bonding the Fabry-Perot interference filter 10 and the main body portion 200. Accordingly, the held state of the Fabry-Perot interference filter 10 in the third widened portion 203 of the main body portion 200 can be stabilized.

In the light detection device 1B, the heat conducting member 15 is disposed on the bottom surface of the third widened portion 203 along the clearance between the side surface of the Fabry-Perot interference filter 10 and the inner surface of the third widened portion 203 and comes into contact with each of a portion of the side surface of the Fabry-Perot interference filter 10 and the bottom surface of the third widened portion 203. Accordingly, the Fabry-Perot interference filter 10 and the light detector 8 can be more efficiently maintained at a uniform temperature, and the held state of the Fabry-Perot interference filter 10 in the third widened portion 203 of the main body portion 200 can be more reliably stabilized.

In the light detection device 1B, the temperature control element 50 is embedded in the wall portion of the package 2. Accordingly, the volume of a space inside the package 2 can be reduced. As a result, the Fabry-Perot interference filter 10 and the light detector 8 can be more efficiently maintained at a uniform temperature.

[Modification Example]

Hereinabove, the first embodiment and the second embodiment of the present disclosure have been described. However, the light detection device of the present disclosure is not limited to the first embodiment and the second embodiment described above. For example, the material and the shape of each configuration are not limited to the material and the shape described above, and various materials and shapes can be employed.

Figure 7:
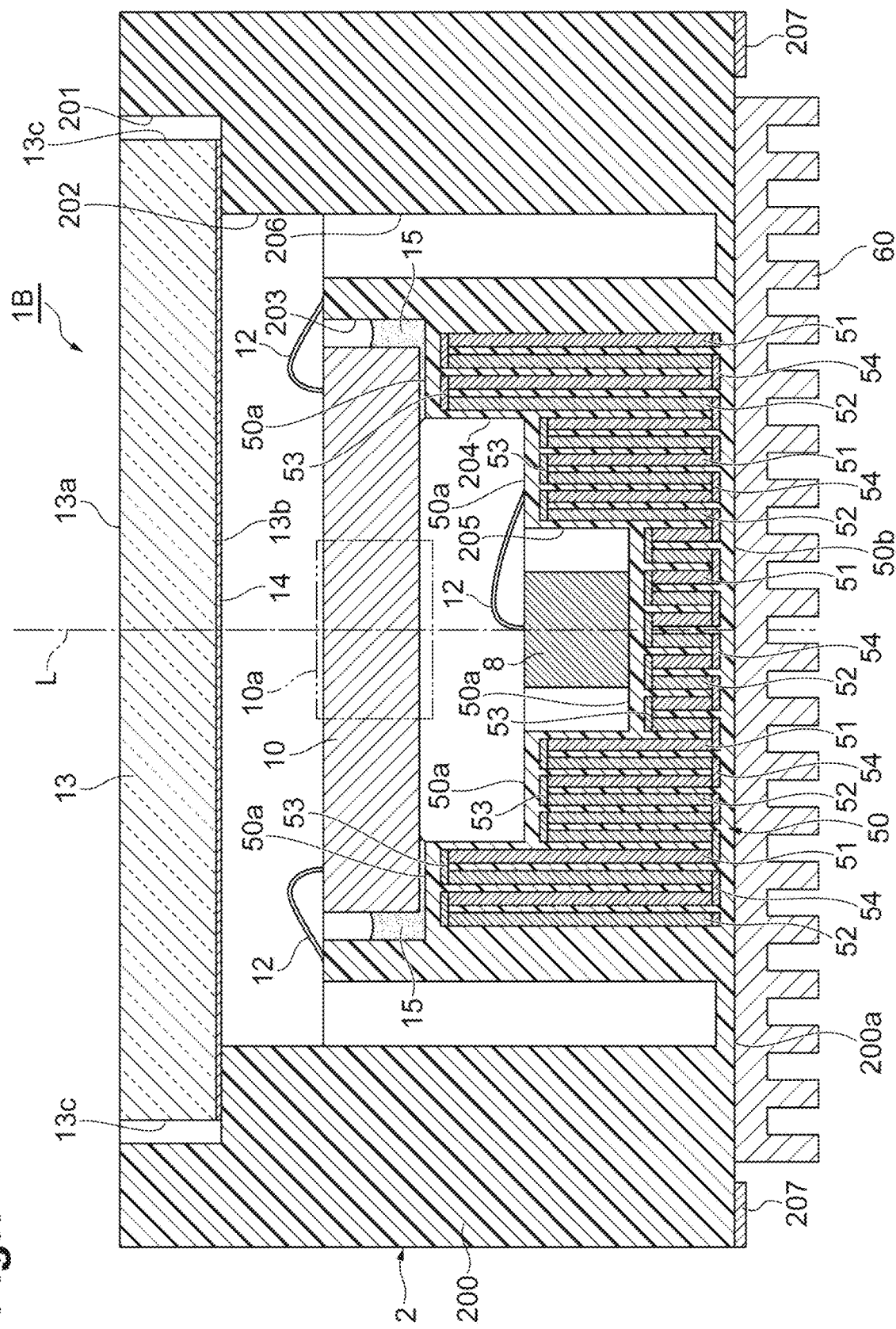
FIG. 7 is a cross-sectional view of a modification example of the light detection device of the second embodiment.

In addition, as illustrated in FIG. 7, as a modification example of the light detection device 1B of the second embodiment, an annular groove 206 surrounding the temperature control element 50, the light detector 8, the heat conducting member 15, and the Fabry-Perot interference filter 10 may be formed in the main body portion 200. According to this configuration, the temperature control element 50, the light detector 8, the heat conducting member 15, and the Fabry-Perot interference filter 10 can be thermally separated from each other. As a result, the Fabry-Perot interference filter 10 and the light detector 8 can be more efficiently maintained at a uniform temperature.

Figure 8:
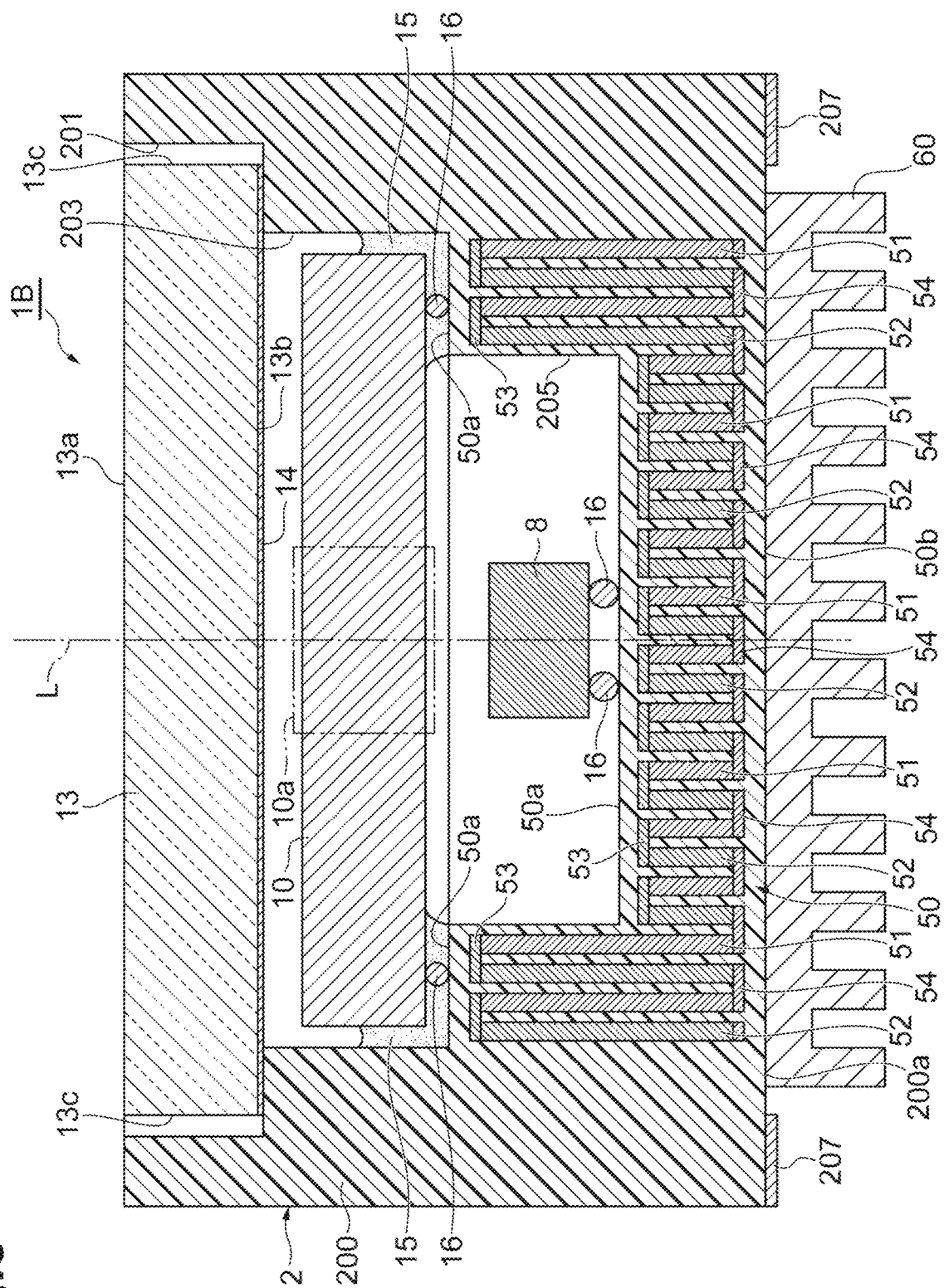
FIG. 8 is a cross-sectional view of another modification example of the light detection device of the second embodiment.

In addition, as illustrated in FIG. 8, as another modification example of the light detection device 1B of the second embodiment, the terminal of the Fabry-Perot interference filter 10 and the terminal of the light detector 8 may be connected to a wiring (not illustrated) laid in the main body portion 200 by a bump 16. According to this configuration, since the wire 12 becomes no longer necessary, the light detection device 1B can be reduced in size.

In addition, in each of the light detection device 1A of the first embodiment and the light detection device 1B of the second embodiment, the band-pass filter 14 may be provided on the light receiving surface 13a of the light transmitting member 13 or may be provided on both the light receiving surface 13a and the light emitting surface 13b of the light transmitting member 13.

In addition, in each of the light detection device 1A of the first embodiment and the light detection device 1B of the second embodiment, the Fabry-Perot interference filter 10 does not have to include the lamination structure (the antireflection layer 41, the third laminate 42, the intermediate layer 43, the fourth laminate 44, the light shielding layer 45, and the protective layer 46) provided on the surface 21b of the substrate 21 on the light emitting side. In addition, only a part of layers (for example, only the antireflection layer 41 and the protective layer 46) may be included as necessary.

In addition, in each of the light detection device 1A of the first embodiment and the light detection device 1B of the second embodiment, the outer edge of the light transmitting region 10a of the Fabry-Perot interference filter 10 may be positioned outside the outer edge of the opening 2a when seen in a direction parallel to the line L. In this case, the proportion of light entering the light transmitting region 10a to light received through the opening 2a increases, and efficiency of utilizing light received through the opening 2a is enhanced. In addition, even if the opening 2a is positionally misaligned with the light transmitting region 10a to a certain degree, light received from the opening 2a enters the light transmitting region 10a. Therefore, requirements of positional accuracy at the time of assembling the light detection devices 1A and 1B are relaxed.

In addition, in each of the light detection device 1A of the first embodiment and the light detection device 1B of the second embodiment, if the heat conducting member 15 includes the first part 15a, the heat conducting member 15 does not have include the second part 15b. The material of the heat conducting member 15 is not limited to the materials described above and may be metal such as solder.

In addition, in each of the light detection device 1A of the first embodiment and the light detection device 1B of the second embodiment, the endothermic region 50a of the temperature control element 50 may directly be in contact with the Fabry-Perot interference filter 10 to be thermally connected to the Fabry-Perot interference filter 10 or may be thermally connected to the Fabry-Perot interference filter 10 via a certain member. Similarly, the endothermic region 50a of the temperature control element 50 may directly be in contact with the light detector 8 to be thermally connected to the light detector 8 or may be thermally connected to the light detector 8 via a certain member.

In addition, in the light detection device 1A of the first embodiment, the exothermic region 50b of the temperature control element 50 may directly be in contact with the package 2 to be thermally connected to the package 2 or may be thermally connected to the package 2 with a certain member interposed therebetween.

In addition, in each of the light detection device 1A of the first embodiment and the light detection device 1B of the second embodiment, the light detector 8 may be directly disposed on the temperature control element 50 or may be disposed on the temperature control element 50 via a certain member.

In addition, in each of the light detection device 1A of the first embodiment and the light detection device 1B of the second embodiment, the temperature control element 50 is used for the purpose of cooling the inside of the package 2. This is effective when the usage environment temperature of the light detection devices 1A and 1B is higher than a set temperature (appropriate operation temperature) of the Fabry-Perot interference filter 10 and the light detector 8. In contrast, when the usage environment temperature of the light detection devices 1A and 1B is lower than a set temperature of the Fabry-Perot interference filter 10 and the light detector 8, the temperature control element 50 may be used for the purpose of heating the inside of the package 2. That is, in the temperature control element 50, the region which has functioned as the endothermic region 50a (first region thermally connected to the Fabry-Perot interference filter 10 and the light detector 8) may function as the exothermic region 50b, and the region which has functioned as the exothermic region 50b (in the light detection device 1A of the first embodiment, the second region thermally connected to the package 2) may function as the endothermic region 50a. Accordingly, even when the usage environment temperature of the light detection devices 1A and 1B is low, the Fabry-Perot interference filter 10 and the light detector 8 accommodated in the package 2 can be maintained at a uniform temperature. Particularly, shifting of a wavelength of transmitted light caused by a change in usage environment temperature of the light detection devices 1A and 1B can be restrained. In addition, it is possible to restrain damage (occurrence of a crack caused by a stress difference between the light receiving surface 13a which contracts due to the low outside air temperature and the light emitting surface 13b which is heated and expands) of the light transmitting member 13 caused when the light transmitting member 13 is excessively heated and a difference between the temperature of the light transmitting member 13 and the outside air temperature (usage environment temperature of the light detection devices 1A and 1B) increases. If a Peltier element is used as the temperature control element 50, the endothermic region and the exothermic region can be easily switched by switching the direction in which a current flows in the Peltier element.

REFERENCE SIGNS LIST 1A, 1B: Light detection device, 2: Package, 2a: Opening, 8: Light detector, 9: Support member, 9a: Placement surface, 10: Fabry-Perot interference filter, 10a: Light transmitting region, 10b: Bottom surface, 10c: Side surface, 13: Light transmission member, 15: Heat conducting member, 35: First mirror, 36: Second mirror, 50: Temperature control element, 50a: Endothermic region, 50b: Exothermic region, C: Corner portion, L: Line.

The invention claimed is:

1. A light detection device comprising:
a Fabry-Perot interference filter having a first mirror and a second mirror with a variable distance therebetween and provided with a light transmitting region transmitting light corresponding to the distance between the first mirror and the second mirror on a predetermined line;
a light detector disposed on one side with respect to the Fabry-Perot interference filter on the line and configured to detect light transmitted through the light transmitting region;
a package having an opening positioned on the other side with respect to the Fabry-Perot interference filter on the line and configured to accommodate the Fabry-Perot interference filter and the light detector;
a light transmitting member provided in the package such that the opening is blocked; and
a temperature control element having a first region thermally connected to the Fabry-Perot interference filter and the light detector and configured to function as one of an endothermic region and an exothermic region,
wherein the first region is positioned on the one side with respect to the light detector at least on the line,
wherein an outer edge of the opening is positioned inside an outer edge of the Fabry-Perot interference filter when seen in a direction parallel to the line,
wherein the temperature control element having a second region thermally connected to the package and configured to function as the other of the endothermic region and the exothermic region, and
wherein a region at which the light transmitting member is joined to an inner surface of a ceiling of the package is positioned so as to extend from inside to outside the outer edge of the Fabry-Perot interference filter when seen in the direction parallel to the line.

2. The light detection device according to claim 1, wherein an outer edge of the light transmitting member is positioned outside the outer edge of the Fabry-Perot interference filter when seen in the direction parallel to the line.

3. The light detection device according to claim 1, wherein the temperature control element is disposed inside the package,
wherein the light detector is disposed on the temperature control element, and
wherein the Fabry-Perot interference filter is disposed on the temperature control element such that the light detector is positioned between the temperature control element and the Fabry-Perot interference filter.

4. The light detection device according to claim 1, further comprising:
a support member configured to support a portion of a bottom surface of the Fabry-Perot interference filter outside the light transmitting region; and
a heat conducting member being in contact with a side surface of the Fabry-Perot interference filter and the support member.

5. The light detection device according to claim 4, wherein the heat conducting member is a bonding member bonding the Fabry-Perot interference filter and the support member.

6. The light detection device according to claim 4, wherein the support member has a placement surface on which the portion of the bottom surface of the Fabry-Perot interference filter outside the light transmitting region is placed,
wherein at least a portion of the side surface of the Fabry-Perot interference filter is positioned on the placement surface such that a portion of the placement surface is disposed outside the side surface, and
wherein the heat conducting member is disposed in a corner portion formed by the side surface and the portion of the placement surface and is in contact with each of the side surface and the portion of the placement surface.

7. The light detection device according to claim 1, wherein the temperature control element is embedded in a wall portion of the package.

* * * * *